United States Patent
Brown

[11] Patent Number: 6,104,595
[45] Date of Patent: Aug. 15, 2000

[54] METHOD AND APPARATUS FOR DISCHARGING AN ELECTROSTATIC CHUCK

[75] Inventor: Karl Brown, San Jose, Calif.

[73] Assignee: Applied Materials, Inc., Santa Clara, Calif.

[21] Appl. No.: 09/251,709

[22] Filed: Feb. 17, 1999

Related U.S. Application Data

[60] Provisional application No. 60/080,977, Apr. 6, 1998.

[51] Int. Cl.[7] .................................................. H01G 1/00
[52] U.S. Cl. ............................................ 361/212; 361/234
[58] Field of Search .................................... 361/233–235; 279/128

[56] References Cited

U.S. PATENT DOCUMENTS

| | | | |
|---|---|---|---|
| 4,667,110 | 5/1987 | Kariya | 250/492.2 |
| 5,117,121 | 5/1992 | Watanabe et al. | 307/130 |
| 5,382,311 | 1/1995 | Ishikawa et al. | 156/345 |
| 5,459,632 | 10/1995 | Birang et al. | 361/234 |
| 5,764,471 | 6/1998 | Burkhart | 361/234 |

FOREIGN PATENT DOCUMENTS

| | | | |
|---|---|---|---|
| 10189699 | 7/1998 | Japan | H01L 21/68 |

*Primary Examiner*—Stephen W. Jackson
*Attorney, Agent, or Firm*—Thomason, Moser & Patterson

[57] ABSTRACT

A method and apparatus for discharging a residual charge from an electrostatic chuck having one or more electrodes. The discharge process involves exposing a surface of the electrostatic chuck to energetic particles such as photons. The discharge apparatus includes a source of energetic particles as part of a semiconductor wafer processing system controlled by a computer. The source of energetic particles may be lamps such as "bakeout" lamps that are generally located within the process chamber. Photons in the form of infrared radiation from the lamps excite certain dopant atoms within the chuck material causing the material to exhibit the photoconductive effect. Such a photoconductive state will allow any residual charge on the surface of the chuck to be conducted away through the chuck electrodes.

23 Claims, 4 Drawing Sheets

METHOD AND APPARATUS FOR DISCHARGING AN ELECTROSTATIC CHUCK

This application claims the benefit of U.S. provisional application Ser. No. 60/080,977 filed Apr. 6, 1998, which is hereby incorporated herein by reference.

BACKGROUND OF THE DISCLOSURE

1. Field of the Invention

The invention relates to semiconductor wafer processing systems and, more particularly, the invention relates to a method and apparatus for discharging an electrostatic chuck used to retain a semiconductor wafer in such a semiconductor wafer processing system.

2. Description of the Background Art

Electrostatic chucks are used for holding a workpiece in various applications ranging from holding a sheet of paper in a computer graphics plotter to holding a semiconductor wafer within a semiconductor wafer processing system. Although electrostatic chucks vary in design, they all are based on the principal of applying a voltage to one or more electrodes embedded in the chuck so as to induce opposite polarity charges in the workpiece and electrode(s), respectively. The electrostatic attractive force between the opposite charges pulls the workpiece against the chuck, thereby retaining the workpiece.

A problem with electrostatic chucks is the difficulty of removing the electric charge from the workpiece and the chuck when it is desired to release the workpiece from the chuck. One conventional solution is to connect both the electrode and the workpiece to ground to drain the charge. Another conventional solution, which purportedly removes the charge more quickly, is to reverse the polarity of DC voltage applied to the electrodes. This technique is described in the context of a chuck having two electrodes (a bipolar chuck) in U.S. Pat. No. 5,117,121 issued May 26, 1992 to Watanabe, et al.

A shortcoming that has been observed with these conventional approaches to removing the electric charge is that they fail to completely remove the charge, so that some electrostatic force remains between the workpiece and the chuck. This residual electrostatic force necessitates the use of a large mechanical force to separate the workpiece from the chuck. When the workpiece is a semiconductor wafer, the force required for removal sometimes cracks or otherwise damages the wafer. Even when the wafer is not damaged, the difficulty of mechanically overcoming the residual electrostatic force sometimes causes the wafer to pop off the chuck unpredictably into a position from which it is difficult to retrieve using a conventional wafer transport robot.

To more accurately reduce the residual electrostatic attractive force that remains between the workpiece and the chuck, attempts have been made to optimize the dechucking voltage by performing measurements upon the chucked wafer to determine an optimal dechucking voltage. One such active dechucking arrangement is disclosed in commonly assigned U.S. Pat. No. 5,459,632 issued Oct. 17, 1995 to Birang, et al. incorporated herein by reference. This dechucking method, like most optimizing type dechucking methods, optimizes the magnitude of the dechucking voltage. As such, these systems may attain an optimal dechucking voltage for a given dechucking period, but this combination of dechucking voltage and dechucking period may not be optimal for dechucking the wafer.

Additionally, when successively processing a plurality of workpieces, previous chucking/dechucking methods apply the same polarity voltages for each chuck/dechuck cycle. This leads to chuck dielectric polarization and an accumulation of residual charge on the chuck surface. The result is increasing difficulty in dechucking each successive wafer.

This accumulation of the residual charge is also detrimental to chucking of the wafer. The accumulated charge interferes with the chucking voltage by either being additive, if the accumulated charge has the same polarity as the chucking voltage, or is subtractive, if the accumulated charge has an opposite polarity as the chucking voltage.

To decrease the residual charge, the chuck can be utilized at high temperatures. In certain ceramic chucks, using the chuck at a higher temperature (e.g., greater than 200° C.) makes the chuck material more conductive. As such, some of the residual charge will dissipate by conduction through the chuck to the electrodes as long as the chuck is maintained at the high temperature.

Therefore, there is a need in the art for a method to discharge the residual charge on the electrostatic chuck without relying on a high temperature to induce conduction.

SUMMARY OF THE INVENTION

The disadvantages of the prior art are overcome by the present invention of a method and apparatus for discharging a residual charge from an electrostatic chuck. The discharge process involves exposing the surface of an electrostatic chuck to a source of energy that bombards the surface with energetic particles, e.g., photons. The electrostatic chuck can be any form of chuck having one or more electrodes embedded into a dielectric body. Preferably, the dielectric body is fabricated from a material having a relatively low resistivity (i.e., the material is semiconductive) such as aluminum nitride. Such material contains donor atoms that can be excited to enhance conductivity of the material. In one embodiment of the invention, the conductivity of the chuck material is promoted by exposing the surface of the chuck to photons from a tungsten-halogen lamp or lamps. After exciting the material for 5 seconds to a few minutes, the residual charge on the chuck surface is substantially reduced.

In a physical vapor deposition system that contains "bake out" lamps, the lamps are generally located within the process chamber to provide infra-red radiation that vaporizes water and other liquids in the chamber as the chamber is evacuated. To discharge the electrostatic chuck in accordance with the present invention, these same bake out lamps are turned on after each wafer is removed from the chamber and the surface of the chuck is exposed to illumination that discharges the surface. The exposure is approximately 5 seconds to a few minutes to discharge a significant amount of residual charge.

The invention can be used to discharge residual charge on other ceramic surfaces used to support a wafer such as ceramic heaters and the like. Generally speaking, any material used as a wafer support that can experience a photoconductive effect can benefit from the invention.

Additionally, by using the illumination process of the present invention to remove the residual charge rather than relying on an electrostatic chuck being used at high temperatures only, electrostatic chucks that heretofore were expected to have a minimum temperature of 150 degrees C can now be used at much lower temperatures, e.g., 25 degrees C.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
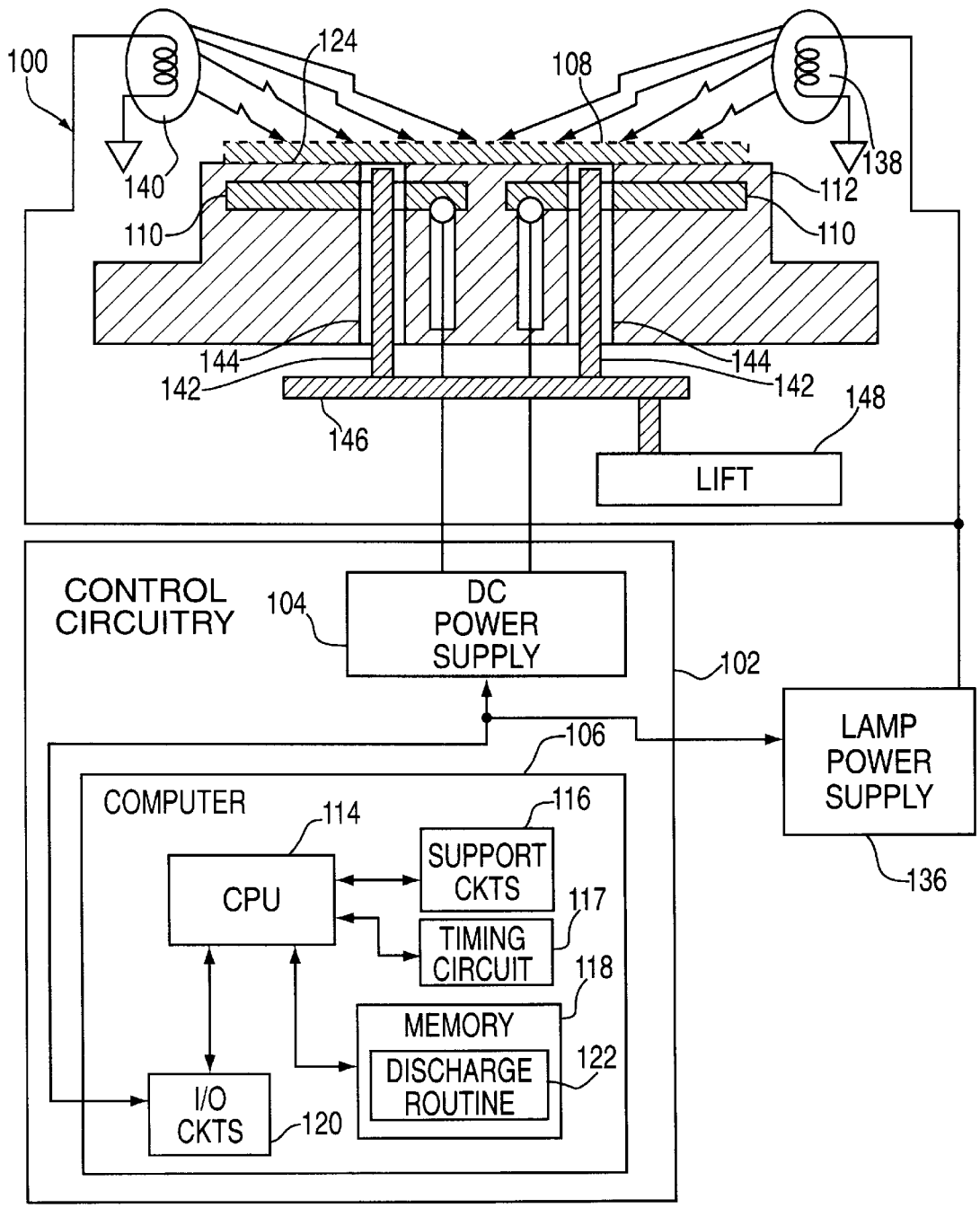
FIG. 1 depicts a sectional view, partially in schematic form, of a conventional electrostatic chuck coupled to a general purpose computer that is programmed to execute the method of the present invention.

FIG. 1 schematically depicts an electrostatic chuck 100 coupled to control circuitry 102. The electrostatic chuck 100 that is depicted is a bipolar chuck having a pair of coplanar electrodes 110 embedded within a dielectric body 112 that forms a support surface 124 upon which the chuck retains a workpiece 108, e.g., a semiconductor wafer (shown in phantom). Although a bipolar chuck is depicted, those skilled in the art will realize from the following discussion that the present invention may be used with any type of electrostatic chuck, including monopolar chucks, dielectric chucks, ceramic chucks, and the like.

To take advantage of the invention, the chuck 100 must be fabricated of a material that can be excited into a conductive state or a semiconductive state when exposed to radiation, e.g., the material must experience a photoconductive effect. Such a chuck material includes aluminum nitride containing dopants such as oxygen or other impurities. This semiconducting form of electrostatic chucks are generally known as Johnsen-Rahbek (J-R) chucks because they rely on the Johnsen-Rahbek effect to provide a substantial chucking force between a wafer and the chuck surface. An aluminum nitride J-R chuck is available as, for example, the MCA electrostatic chuck manufactured by Applied Materials Inc. of Santa Clara, Calif. The MCA electrostatic chuck is disclosed in commonly assigned U.S. Pat. No. 5,656,093 issued to Burkhart et al. on Aug. 12, 1997 and incorporated herein by reference.

The chuck 100 has positioned proximate its surface 124 one or more radiation sources, e.g., lamps 138 and 140. The radiation sources provide radiation (photons) to the chuck material to excite certain dopant atoms such as oxygen to cause the material to become semiconductive, i.e., to experience the photoconductive effect. Such a photoconductive state will discharge any residual charge on the surface of the chuck without heating the electrostatic chuck or using the chuck at an elevated temperature. The residual charge will discharge into the electrodes 110 or, at a minimum, the residual charges will migrate away from the chuck surface such that the surface charge density is substantially reduced. Since the aluminum nitride is transparent, the photoconductive effect is generally a bulk process that causes the entire chuck to become semiconductive upon illumination.

The control circuitry 102 of the electrostatic chuck 100 contains a DC power supply 104 and a lamp power supply 136 that are each controlled by a computer 106. The DC power supply 104 produces variable positive and negative voltages for each electrode of the bipolar chuck to chuck and dechuck the semiconductor wafers 108 in a manner that is well known in the art. The lamp power supply 136 provides a 120 volt lamp voltage that controls the intensity of the lamps 138 and 140.

The wafer 108 is raised and lowered with respect to the chuck surface by several (preferably four but at least three) lift pins 142. Each lift pin 142 slides in a corresponding bore 144 in the body 112 of the chuck 180. All the lift pins 142 are mounted on a carriage 146 that is raised and lowered by a pneumatic lift mechanism 148. The lift mechanism is controlled by signals from the computer 106 via 110 circuits 120.

To control the retention of a wafer 108, the computer 106 sets the output voltage value of the DC power supply 104 to chuck/dechuck the wafer 108 and illuminates the lamps 138 and 140 when the wafer 108 has been removed from the chuck surface 124. The computer 106 is a general purpose, programmable computer system containing a central processing unit (CPU) 114 connected to conventional support circuits 116 such as a power supply, cache, memory, timing circuits, and the like. In addition, the CPU is connected to a timing circuit 117 and memory circuits 118 such as read-only memory (ROM) and random access memory (RAM). The present invention can be implemented as a software program stored in memory 118 as chuck discharge routine 122. Upon execution of this discharging routine, the computer system becomes an apparatus used for discharging the electrostatic chuck. In practice, this discharge routine 122 would be a subroutine of a general chucking and dechucking software routine, where the discharging subroutine is executed after the wafer is dechucked and removed from the chuck and before the next wafer is placed on the chuck surface and chucked.

Figure 2:
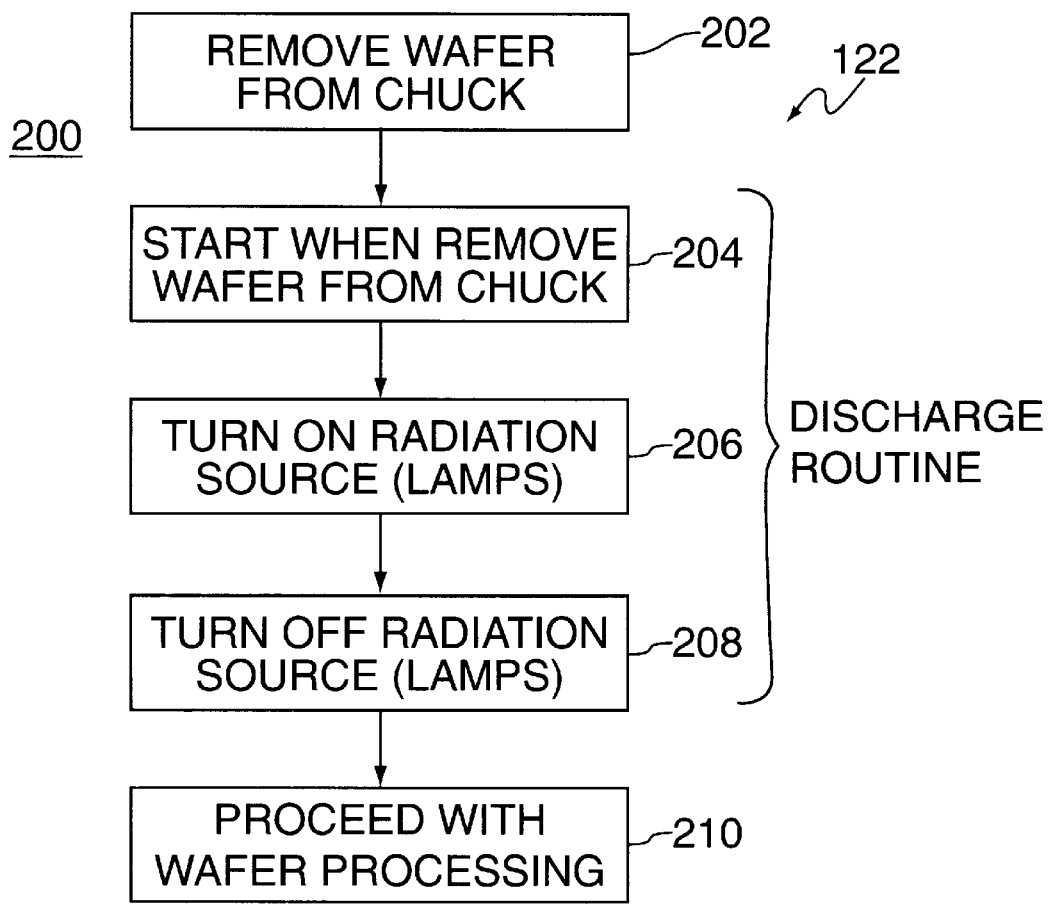
FIG. 2 depicts a flow diagram of the method of the present invention.

FIG. 2 depicts a flow diagram that represents the discharge routine 122 of the present invention. The routine 122 is generally executed, as an interrupt routine that executes every time a wafer is removed from the chuck during a wafer processing routine 200. At step 202 of the wafer processing routine 200, a wafer is removed from the chuck 100. For example, the wafer can be removed by applying a "dechucking" voltage from the D.C. power supply 104 to the chuck electrodes 110. Preferably, the dechucking voltage has a polarity opposite to that of any electrostatic charge held in the dielectric body 112. The dechucking voltage induces a charge in the electrodes 110 which balances the charge held in the dielectric and minimizes the electrostatic attractive force between the chuck 100 and the wafer. The "dechucking" voltage has for example, the same polarity as that applied to the electrodes 110 by the D.C. power supply 104 to retain the workpiece at a different magnitude. The wafer is then physically removed by, for example, raising the lift pins 142. Alternatively, the dechucking voltage can be either zero or of a polarity opposite that of the chucking (i.e. retaining) voltage.

The discharge routine 122 begins at step 204 with the wafer removed from the chuck 100. At step 206, the radiation source (the lamps) are turned on to illuminate the chuck surface for 5 seconds to a few minutes. After a sufficient period of time has elapsed, as determined by the timing circuit 117, the radiation source is turned off at step 208, i.e., the residual charge is now discharged. At step 210, the wafer processing routine 200 proceeds with wafer processing, i.e., another wafer is placed on the chuck surface 124, and is chucked and subsequently processed. The routine 122 may be executed after each wafer is removed from the chuck, or may be executed on a periodic basis (e.g., every Nth wafer)

depending upon the amount of charge accumulated during each wafer processing cycle.

In one illustrative embodiment of the invention, the bake out lamps of a physical vapor deposition (PVD) chamber have been used to illuminate an electrostatic chuck and remove the residual charge therefrom.

Figure 3:
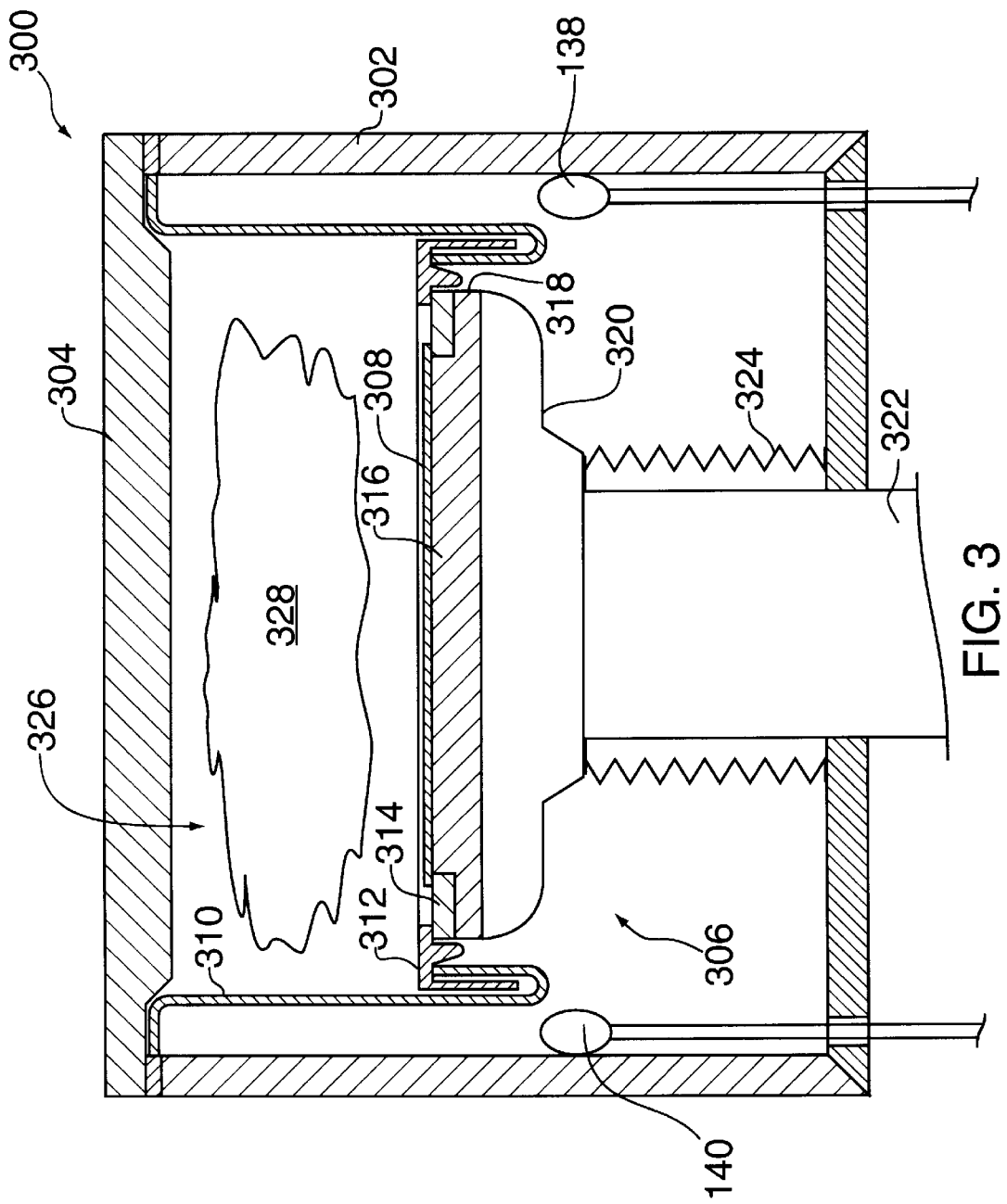
FIG. 3 depicts a semiconductor wafer processing system that is operated in accordance with the present invention having the pedestal in the processing position.

FIG. 3 depicts a cross-sectional, schematic view of a physical vapor deposition (PVD) chamber 300 incorporating the present invention. The chamber 300 contains an enclosure 302 and a target 304 which define a volume within which a pedestal 306 supports a semiconductor wafer 308. A plasma zone 326 is defined by a cylindrical shield 310 which supports a shadow ring 312 that rests upon a waste ring 314. The waste ring 314 is supported by an electrostatic chuck 316. The waste ring 314 rests upon a flange 318 extending circumferentially from the edge of the electrostatic chuck 316. The chuck is attached generally by a peripheral clamp, brazing, or bolts to a pedestal base 320. The base 320 is connected to a shaft 322 which is sealed from the environment of the chamber by bellows 324. The bellows 324 are sealed to the bottom of the chamber enclosure 302 and also the support 320 at each end of the bellows.

FIG. 3 depicts the system having the pedestal 306 in a process position, that is, with the pedestal raised to have the waste ring 314 engage the shadow ring 312. In this position, a plasma 328 is formed above the wafer 308 and the target 304 is sputtered to deposit material onto the wafer 308. The wafer 308 is retained by an electrostatic force between the wafer 308 and the electrostatic chuck 316. In this process position, the bake out lamps 138 and 140 are generally off.

Figure 4:
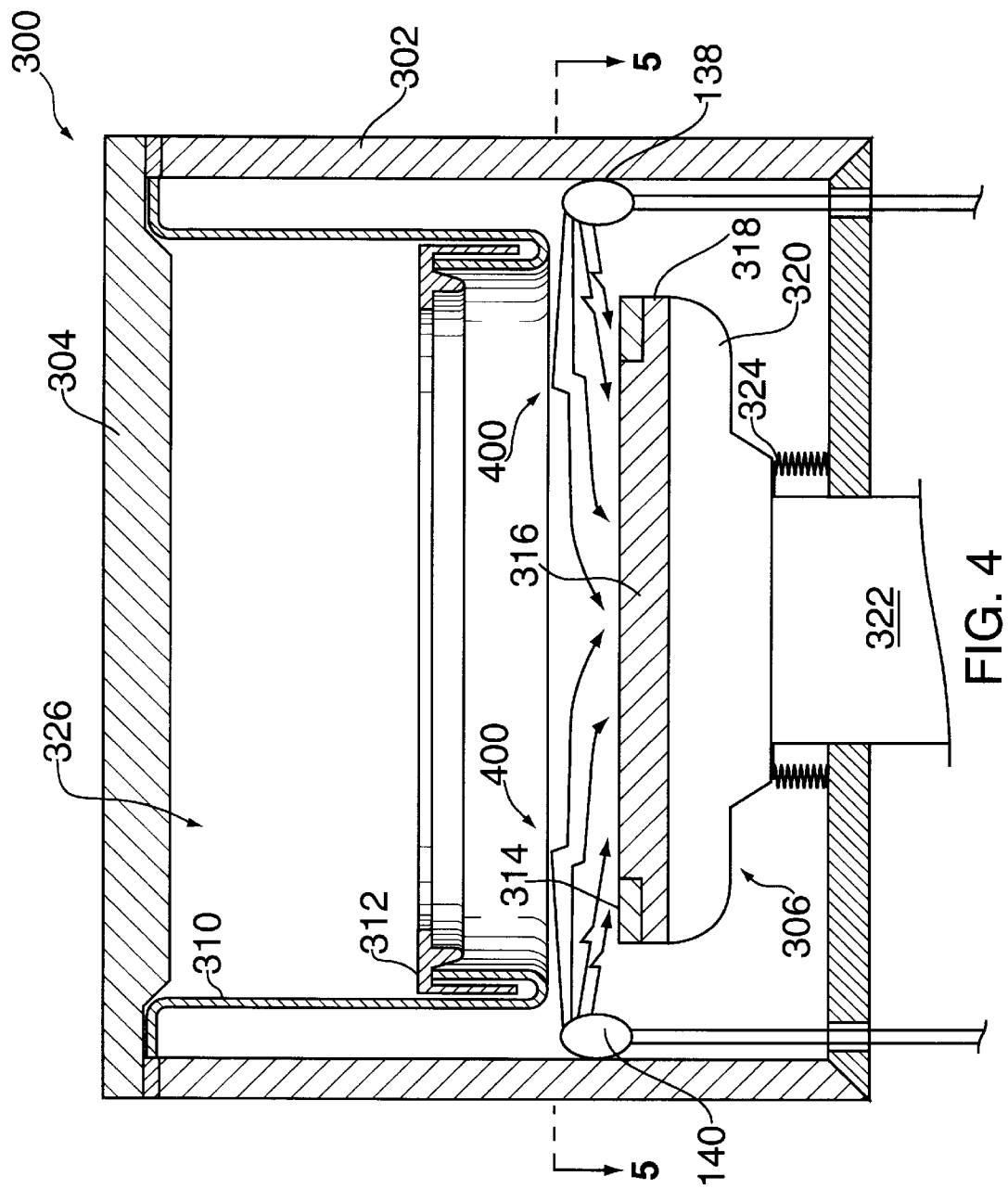
FIG. 4 depicts a semiconductor wafer processing system that is operated in accordance with the present invention having the pedestal in the discharge position.

FIG. 4 depicts the system in a wafer removal position, where the pedestal 308 has been lowered to allow a wafer transport robot (not shown) to access the chamber 302 through a slit valve (not shown). From this position, the wafer is dechucked by the chucking power supply (104 in FIG. 1) using any one of the many wafer dechucking methods available in the art. Once the wafer is removed and before the next wafer is placed on the chuck, the lamps 138 and 140 are turned on. The lamps are generally activated by virtue of a signal sent by a controller to a relay in response to a signal provided to the controller from a robot position sensor indicative of removal of the wafer from the pedestal. Once activated, the lamps illuminate the surface of the chuck as indicated by arrows 400. In about 5 seconds to a few minutes, the photons cause a photoconductive effect that discharges any residual charge remaining on the chuck 316. The duration of illumination is selected to be sufficient to reduce/remove residual charge but minimize the impact on wafer throughput through the chamber. The duration is preferably controlled by a controller timer circuit, but may also be controlled by a signal from the controller to the lamp relay which extinguishes the lamps in response to the positioning of a new wafer at a selected position vis-a-vis the pedestal. Likewise, the extinguish signal could be sent in response to a signal indicative of reduced/eliminated accumulated charge on the electrostatic chuck. Thereafter, the next wafer can be positioned upon the chuck 316 and the pedestal 306 raised into the processing position. Alternatively, the lamps may be continuously illuminated such that the chuck is exposed to the light from the lamps whenever the chuck is lowered as shown in FIG. 4. In this manner, the chuck is automatically discharged during each wafer transfer.

Figure 5:
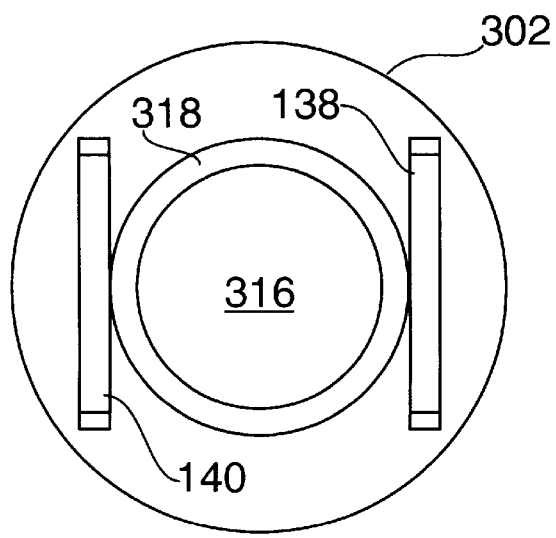
FIG. 5 depicts a top schematic view of a chamber 300 taken along line 5—5 of FIG. 4.

FIG. 5 depicts a top schematic view of the chamber 300 taken along line 5–5 of FIG. 4. The lamps 138 and 140 are mounted lengthwise along the side of the chamber wall 302. The lamps 138 and 140 are, for example, tungsten filament halogen lamps having a 500 watt rating and a length of about 8.7 inches and a diameter of 16 mm. One exemplary lamp is model 10P-500W120V-T3-TB (598850-0) lamp manufactured by Sylvania. These particular lamps are designed as bake out lamps and, as such, produce high intensity infrared radiation. To increase the energy of the photons that impact the electrostatic chuck 316, different lamps can be used to provide a light spectrum that is in the visible or ultra-violet range. As such, an increase in the photoconductive effect is possible and the discharge occurs rather quickly. Furthermore, a supplemental source of illumination, such as an ultra-violet (UV) lamp may be used in conjunction with the bakeout lamps. Such supplemental illumination can be mounted either inside or outside the chamber 300.

By using the illumination process of the present invention to remove the residual charge rather than relying on an electrostatic chuck being used at high temperatures only, electrostatic chucks that heretofore were expected to have a minimum temperature of 150 degrees C can now be used at much lower temperatures, e.g., less than 25 degrees C.

Also, the invention can be used in conjunction with any wafer support (i.e., not only an electrostatic chuck) that contains material that experiences the photoconductive effect. Such supports include ceramic heaters and the like.

Although various embodiments which incorporate the teachings of the present invention have been shown and described in detail herein, those skilled in the art can readily devise many other varied embodiments that still incorporate these teachings.

What is claimed is:

1. A method of discharging a residual charge from a surface of a workpiece support, comprising the step of:
 exposing said surface to energetic non-ionized particles when a workpiece is not present on said workpiece support to increase the conductivity of said surface wherein said increased conductivity causes said residual charge to move off of said surface.

2. The method of claim 1 wherein said surface is a support surface of an electrostatic chuck.

3. The method of claim 1, wherein said energetic particles are photons.

4. The method of claim 1, wherein said surface is exposed to said energetic particles for a period of at least 5 seconds.

5. The method of claim 1, wherein said surface is located within a semiconductor wafer processing chamber.

6. The method of claim 5, wherein said energetic particles are provided by a source located within said semiconductor wafer processing chamber.

7. The method of claim 6, wherein said source comprises a bake out lamp.

8. The method of claim 1, wherein said surface is substantially fabricated of a low resistivity dielectric.

9. A method of claim 8 wherein said low resistivity dielectric is a ceramic material.

10. The method of claim 9 wherein said ceramic material contains aluminum nitride and dopants.

11. The method of claim 1 wherein said residual charges are discharged through at least one electrode.

12. A method for discharging a residual charge from a surface of an electrostatic chuck in a semiconductor wafer processing chamber comprising the steps of:
 disposing a lamp, within said chamber, proximate said electrostatic chuck;
 activating said lamp to produce photons; and exposing said surface of said electrostatic chuck to said photons such that said electrostatic chuck experiences a photoconductive effect that discharges the residual charge.

13. The method of claim 12 wherein said electrostatic chuck comprises a body fabricated from a ceramic material containing aluminum nitride.

14. The method of claim 13 wherein said ceramic material contains oxygen.

15. The method of claim 12 wherein said exposing step further comprises the steps of:

physically moving said electrostatic chuck into a position to expose the wafer support surface of said electrostatic chuck to said photons.

16. The method of claim 12 wherein said exposing step further comprises the steps of:

moving the electrostatic chuck from a process position to a wafer transport position;

while the electrostatic chuck is in the wafer transport position, removing a semiconductor wafer from said wafer support surface to expose the wafer support surface of said electrostatic chuck to said photons such that said electrostatic chuck experiences a photoconductive effect;

after the residual charge on the wafer support surface is decreased by the photoconductive effect, placing a semiconductor wafer upon the wafer support surface; and moving the electrostatic chuck from the wafer transport position into the process position.

17. Apparatus for discharging a residual charge from a surface of a wafer support, comprising:

a source of energy for bombarding said surface of said wafer support with energetic non-ionized particles;

a computer for controlling said wafer support and said source of energy; and a computer program executing on said computer that instructs said wafer support and said source of energy to perform the following steps, activating said source of energy when a wafer is not present on the wafer support to bombard the wafer support with energetic particles, and deactivating said source of energy after said residual charge is decreased.

18. The apparatus of claim 17, wherein the wafer support is fabricated of ceramic.

19. The apparatus of claim 17, wherein said source of energy is a lamp producing photons.

20. The apparatus of claim 17, wherein said source of energy is activated for a period of at least 5 seconds.

21. The apparatus of claim 17, wherein said wafer support is an electrostatic chuck.

22. The apparatus of claim 21, wherein said electrostatic chuck is a Johnsen-Rahbek effect chuck.

23. The apparatus of claim 17 further comprising a timing circuit coupled to said source of energy.

* * * * *